(12) United States Patent
Kim et al.

(10) Patent No.: US 8,609,507 B2
(45) Date of Patent: Dec. 17, 2013

(54) SEMICONDUCTOR DEVICE AND METHOD OF MANUFACTURING THE SAME

(75) Inventors: Tae Kyung Kim, Chungcheongbuk-do (KR); Min Sik Jang, Gyeonggi-do (KR); Sung Deok Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 102 days.

(21) Appl. No.: 13/149,365

(22) Filed: May 31, 2011

(65) Prior Publication Data
US 2012/0280300 A1 Nov. 8, 2012

(30) Foreign Application Priority Data
May 4, 2011 (KR) .................... 10-2011-0042520

(51) Int. Cl.
*H01L 21/764* (2006.01)
(52) U.S. Cl.
USPC ............... 438/421; 438/422; 257/E21.573; 257/E21.581
(58) Field of Classification Search
USPC ......... 438/257, 309–378, 421–422, 593, 201, 438/211, 581, 583, 655, 664, 682
See application file for complete search history.

(56) References Cited

U.S. PATENT DOCUMENTS

| | | | | |
|---|---|---|---|---|
| 6,423,630 B1* | 7/2002 | Catabay et al. | ............... | 438/624 |
| 7,402,499 B2* | 7/2008 | Kitamura et al. | ............ | 438/429 |
| 7,800,155 B2* | 9/2010 | Matsuno | ................... | 257/315 |
| 7,855,139 B2* | 12/2010 | Smith | ........................ | 438/619 |
| 2003/0003661 A1* | 1/2003 | Lee | .............................. | 438/258 |
| 2009/0218614 A1* | 9/2009 | Aoyama et al. | ............. | 257/324 |

FOREIGN PATENT DOCUMENTS

| | | |
|---|---|---|
| JP | 2006-302950 | 11/2006 |
| JP | 2009-212218 | 9/2009 |
| KR | 1020100095724 | 9/2010 |
| KR | 1020120031667 | 4/2012 |

OTHER PUBLICATIONS

Notice of Allowance issued by the Korean Intellectual Property Office on Jan. 29, 2013.

* cited by examiner

*Primary Examiner* — Jenny L Wagner
*Assistant Examiner* — Abbigale Boyle
(74) *Attorney, Agent, or Firm* — IP & T Group LLP

(57) ABSTRACT

A semiconductor device includes gates formed over a semiconductor substrate that are spaced apart from one another and each have a stack structure of a tunnel insulation layer, a floating gate, a dielectric layer, a first conductive layer, and a metal silicide layer, a first insulation layer formed along the sidewalls of the gates and a surface of the semiconductor substrate between the gates and configured to have a height lower than the top of the metal silicide layer; and a second insulation layer formed along surfaces of the first insulation layer and surfaces of the metal silicide layer and configured to cover an upper portion of a space between the gates, wherein an air gap is formed between the gates.

9 Claims, 8 Drawing Sheets

SEMICONDUCTOR DEVICE AND METHOD OF MANUFACTURING THE SAME

CROSS-REFERENCE TO RELATED APPLICATION

Priority to Korean patent application number 10-2011-0042520 filed on May 4, 2011, the entire disclosure of which is incorporated by reference herein, is claimed.

BACKGROUND

Exemplary embodiments relate to a semiconductor device and a method of manufacturing the same and, more particularly, to a semiconductor device including a metal silicide layer formed by a silicidation process and a method of manufacturing the same.

With the increasing integration degree of semiconductor device, the width of conductive wires within semiconductor device and a space between the conductive wires become smaller. In reducing interference between conductive wires, where interference normally tends to increase with the space/width, air gaps may be formed between neighboring conductive wires. Further, in improving resistance of the conductive wire which varies according to a reduction in the width, a part of the conductive wire made be formed into a metal silicide layer by siliciding a part of a stack layer forming the conductive wires. Here, in using both the air gap formation process and the silicidation process, electrical properties of semiconductor device may be degraded during a polish process or a dry etch process which are performed in advance for the silicidation process.

Features of the silicidation process are described in more detail below by taking a process of forming the word lines of a NAND flash memory device as an example with reference to FIGS. 1A and 1B.

Referring to FIG. 1A, a tunnel insulation layer 13 and a conductive layer 15 for a floating gate are formed over the active regions of a semiconductor substrate 11, including isolation regions and the active regions. For reference, FIGS. 1A and 1B are the cross-sectional views taken along a direction parallel to the active region of the semiconductor substrate 11.

Next, a dielectric layer 17 and a polysilicon layer (that is, a first conductive layer 19 for a control gate) are sequentially stacked. Gate hard mask patterns 21 are formed over the first conductive layer 19. Each of the gate hard mask patterns 21 is formed as a line type structure elongated in a direction crossing the active regions in order to define regions where the word lines are formed.

Next, the first conductive layer 19, the dielectric layer 17, and the conductive layer 15 are etched by using the gate hard mask patterns 21 as an etch mask. Consequently, the first conductive layer 19, the dielectric layer 17, and the conductive layer 15 are patterned along the active regions, thereby forming a plurality of stack patterns MP spaced apart from one another along the active regions. Each of the stack patterns MP includes first control gates CG1 coupled in a direction crossing the active regions, floating gates FG spaced apart from one another in a direction crossing the active regions, and the dielectric layer 17 formed between each of the first control gates CG1 and each of the floating gates FG.

Next, cell junctions 11a are formed by implanting impurities into the semiconductor substrate 11 between the gate hard mask patterns 21.

An insulation layer 25 is formed on the entire structure in which the cell junctions 11a are formed. The insulation layer 25 may be a spacer layer for protecting the sidewalls of the stack patterns MP. If a space between the stack patterns MP is formed to be narrow in order to increase the integration degree of semiconductor device, an upper portion of the space between the stack patterns MP is covered by the insulation layer 25 before the entire space between the stack patterns MP is filled with the insulation layer 25. Accordingly, an air gap 23 is formed between the stack patterns MP.

Referring to FIG. 1B, in order to improve resistance of the first control gate CG1, a process of siliciding an upper portion of the first control gate CG1 is performed. In order to perform the silicidation process, a process of exposing the first conductive layer 19 (that is, the polysilicon layer) is performed in advance. Next, the following processes are performed: a process of forming a metal layer over the exposed first conductive layer 19, a process of forming a first metal silicide layer by performing a primary annealing process so that metal of the metal layer is diffused into the first conductive layer 19 (that is, the polysilicon layer), a process of removing the remaining metal layer after the primary annealing process, and the silicidation process including a secondary annealing process of changing the first metal silicide layer into a second metal silicide layer 27, which is more stable than the first metal silicide layer and having low resistance. The metal silicide layer 27 formed by the secondary annealing process becomes second control gates CG2.

The second control gates CG2 are formed by siliciding the upper portions of the first control gates CG1, thus becoming word lines.

The process of exposing the first conductive layer 19 may be performed using chemical mechanical polishing (CMP) process (that is, a polish process) or an etch-back process (that is, a dry etch process). However, if the first conductive layer 19 is exposed by the CMP process, scratches may be formed on a surface of the first conductive layer 19 or slurry used when the CMP process may remain within the opened air gaps 23. Further, if the first conductive layer 19 is exposed by the etch-back process, the insulation layer 25 remaining on the sidewalls of the stack patterns MP and at the bottom of the air gaps 23 may be lost. Further, a surface A of the semiconductor substrate is exposed because the insulation layer 25 remained in the air gaps 23 is lost by the etch-back process.

Here, a method of improving the polish process or the dry etch process is useful to prevent degradation of electrical properties of semiconductor device.

BRIEF SUMMARY

Exemplary embodiments relate to a semiconductor device and a method of manufacturing the same, which prevent damage to a surface of a semiconductor substrate or a surface of a polysilicon layer in a process of forming a metal silicide layer through a silicidation process.

A semiconductor device according to an aspect of the present disclosure includes gates formed over a semiconductor substrate that are spaced apart from one another and each have a stack structure of a tunnel insulation layer, a floating gate, a dielectric layer, a first conductive layer, and a metal silicide layer; a first insulation layer formed along the sidewalls of the gates and a surface of the semiconductor substrate between the gates and configured to have a height lower than the top of the metal silicide layer; and a second insulation layer formed along surfaces of the first insulation layer and surfaces of the metal silicide layer and configured to cover an upper portion of a space between the gates, wherein an air gap is formed between the gates.

A method of manufacturing a semiconductor device according to another aspect of the present disclosure includes forming gate patterns that are spaced apart from one another over a semiconductor substrate and each comprise a polysilicon layer; forming a first insulation layer over the semiconductor substrate having the gate patterns formed therein so that a first air gap is formed between the gate patterns; opening the first air gaps by partially removing the first insulation layer over the first air gaps; forming a sacrificial layer made of a material different than that of the first insulation layer over the first insulation layer; partially etching the sacrificial layer and the first insulation layer to expose a part of each of the gate patterns; siliciding the exposed parts of the gate patterns; and forming a second insulation layer over the semiconductor substrate having the silicided gate patterns formed therein, wherein a second air gap is formed between the silicided gate patterns.

A method of manufacturing a semiconductor device according to another aspect of the present disclosure includes forming gate patterns that are spaced apart from one another over a semiconductor substrate; forming a first insulation layer with a first air gap formed therein over the gate patterns; opening the first air gap by partially removing the first insulation layer while leaving the remainder of first insulation layer outlining the first air gap; exposing and siliciding a part of each of the gate patterns; and forming a second insulation layer with a second air gap formed therein over the silicided gate patterns.

DESCRIPTION OF EMBODIMENTS

Figure 1A:
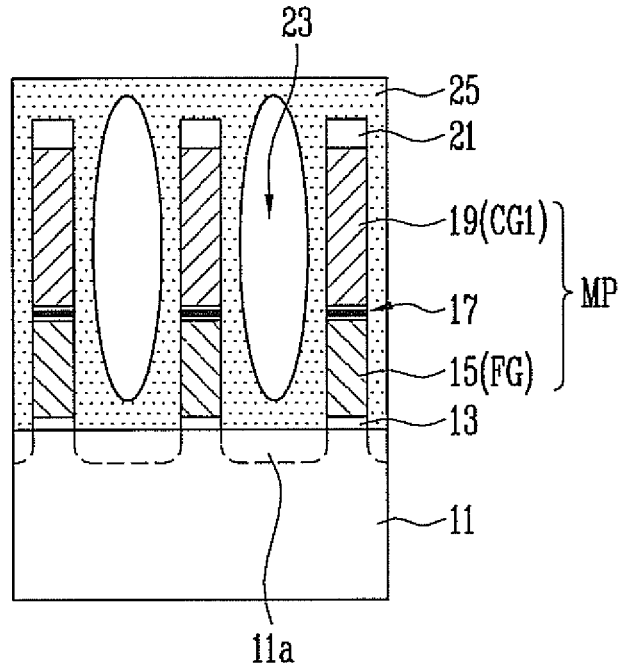
FIGS. 1A and 1B are cross-sectional views illustrating a silicidation process.
Figure 1B:
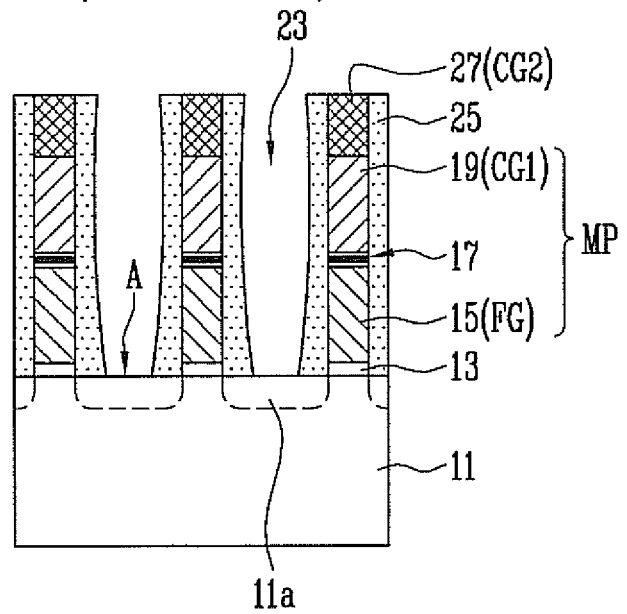

Hereinafter, some exemplary embodiments of the present disclosure will be described in detail with reference to the accompanying drawings. The figures are provided to allow those having ordinary skill in the art to understand the scope of the embodiments of the disclosure.

FIGS. 2A to 2J are cross-sectional views illustrating a semiconductor device and a method of manufacturing the same according to a first exemplary embodiment of this disclosure. In the drawings for the figures, according to an example, word line formation regions coupled to the memory cells of a NAND flash memory device are shown.

Figure 2A:
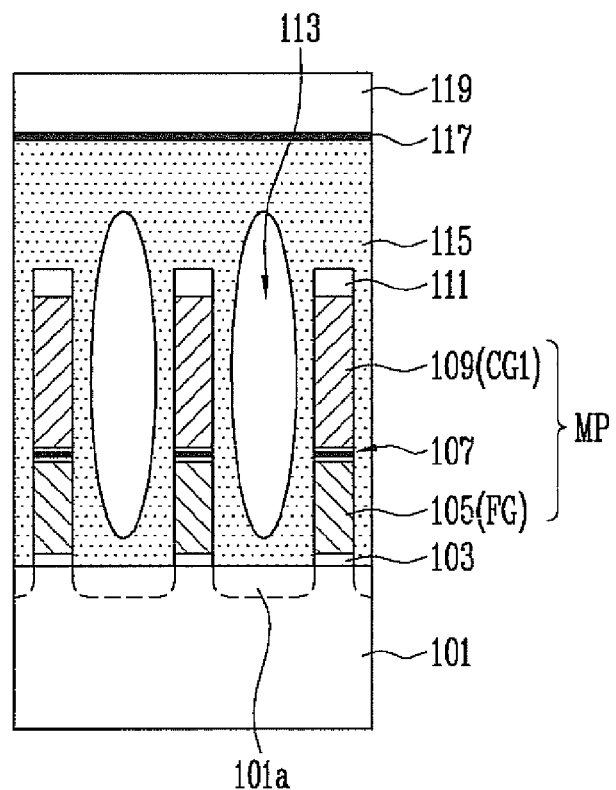
FIGS. 2A to 2J are cross-sectional views illustrating a semiconductor device and a method of manufacturing the same according to a first exemplary embodiment of this disclosure.

Referring to FIG. 2A, a plurality of stack patterns MP spaced apart from one another are formed over a semiconductor substrate 101 including wells (not shown) into which N type impurities or P type impurities have been implanted, where an ion implantation process is performed for controlling the threshold voltage performed therefor. Hereinafter, a method of forming the stack patterns MP is described in more detail by taking a NAND flash memory device as an example.

The semiconductor substrate 101 includes isolation regions (not shown) and active regions which are alternately disposed and extend in parallel to each other. A tunnel insulation layer 103 and a conductive layer 105 for a floating gate are formed over the active regions of the semiconductor substrate 101. The tunnel insulation layer 103 and the conductive layer 105 may remain only over the active regions by stacking the tunnel insulation layer 103 and the conductive layer 105 over the entire semiconductor substrate 101 and then removing the tunnel insulation layer 103 and the conductive layer 105 formed over the isolation regions of the semiconductor substrate 101 that are located between the active regions. Next, trenches (not shown) may be formed in the semiconductor substrate 101 by etching the semiconductor substrate 101 exposed due to the removal of the tunnel insulation layer 103 and the conductive layer 105, and subsequently, the trenches may be filled with an isolation layer.

The tunnel insulation layer 103 may be made of $SiO_2$ and may be formed by an oxidization process or an oxide deposition process. The conductive layer 105 may be made of polysilicon.

Next, a dielectric layer 107 is formed on a surface of the conductive layer 105, remaining over the active regions, and the isolation layer. The dielectric layer 107 may have an ONO structure in which a silicon oxide layer, a silicon nitride layer, and a silicon oxide layer are stacked. Alternatively, the dielectric layer 107 may be formed of a high dielectric (high-k) layer of at least one of an $Al_2O_3$ layer, a $ZrO_2$ layer, and an $HfO_3$ layer having a high dielectric constant in order to obtain an appropriate coupling ratio between a control gate and a conductive layer.

A first conductive layer 109 for a control gate (that is, a polysilicon layer) is formed over the dielectric layer 107. A plurality of gate hard mask patterns 111 spaced apart from one another is formed over the first conductive layer 109. Each of the gate hard mask patterns 111 is formed as a line type structure which is elongated in a direction crossing the active regions in order to define regions in which word lines are formed.

The first conductive layer 109, the dielectric layer 107, and the conductive layer 105 are etched by using the gate hard mask patterns 111 as an etch mask. Consequently, the first conductive layer 109, the dielectric layer 107, and the conductive layer 105 are patterned in a direction crossing the active regions, thus forming the plurality of stack patterns MP spaced apart from one another over each of the active regions. Each of the stack patterns MP includes first control gates CG1 coupled in a direction crossing the active regions, floating gates FG that are spaced apart from one another across the active regions, and the dielectric layer 107 formed between the first control gate CG1 and the floating gate FG. Meanwhile, the tunnel insulation layer 103 may be further etched by using the gate hard mask patterns 111 as an etch mask.

Cell junctions 101a are formed by implanting impurities into the semiconductor substrate 101 between the gate hard mask patterns 111.

A first insulation layer 115 is formed on the entire structure in which the cell junctions 101a are formed. The first insulation layer 115 may be a spacer layer for protecting the sidewalls of the stack patterns MP. Meanwhile, the first insulation layer 115 may also be formed on the sidewalls of the stack patterns formed in the select transistor regions of a NAND flash memory device (not shown) in order to form a lightly doped drain (LDD) structure in the select transistor regions.

If a space between the stack patterns MP is formed to be narrow in order to increase the integration degree of semiconductor device, an upper portion of the space between the stack patterns MP are covered by the first insulation layer 115 before the space below between the stack patterns MP is filled with the first insulation layer 115. Accordingly, a first air gap 113 is formed between the neighboring stack patterns MP.

The first insulation layer 115 preferably is formed of a deposition layer having a low step coverage so that the first air gaps 113 can be formed. For example, the first insulation layer 115 may be formed of a disilane-high temperature oxide (DS-HTO) layer or a plasma enhanced-$SiH_4$ undoped silicate glass (PE-$SiH_4$ USG) layer.

Next, an interlayer insulation layer 119 is formed on the entire structure in which the first insulation layer 115 is formed in order to fill the space between the stack patterns MP of the select transistor regions (not shown). An etch-stop layer 117 may be further formed before the interlayer insulation layer 119 is formed. According to an example, the interlayer insulation layer 119 may be formed of an oxide layer, and the etch-stop layer 117 may be formed of a nitride layer.

Figure 2B:
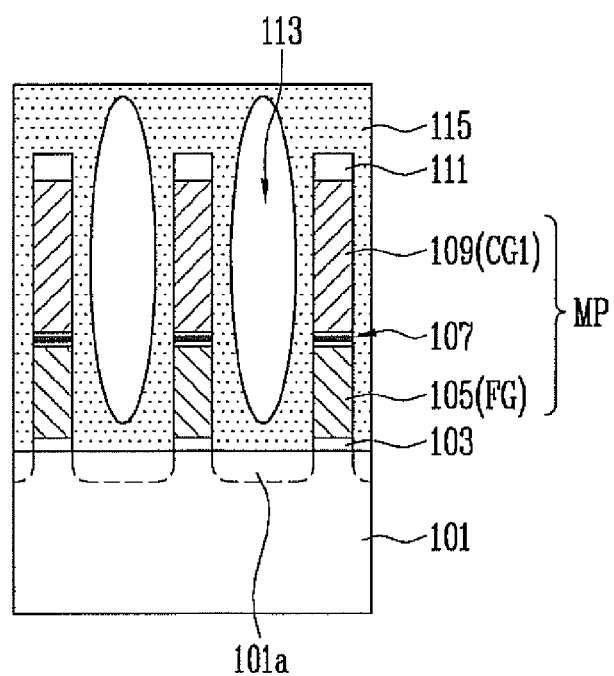

Referring to FIG. 2B, the interlayer insulation layer 119 is polished by a polish process. The polish process may be performed using chemical mechanical polishing (CMP). If the etch-stop layer 117 is formed before the interlayer insulation layer 119 is formed, the polish process is performed until the etch-stop layer 117 is exposed. Next, the etch-stop layer 117 is removed, and part of the first insulation layer 115 is removed by an etch-back process so that the first air gaps 113 are not opened and exposed. That is, the first insulation layer 115 may remain over the first air gaps 113 after the etch-back process.

Figure 2C:
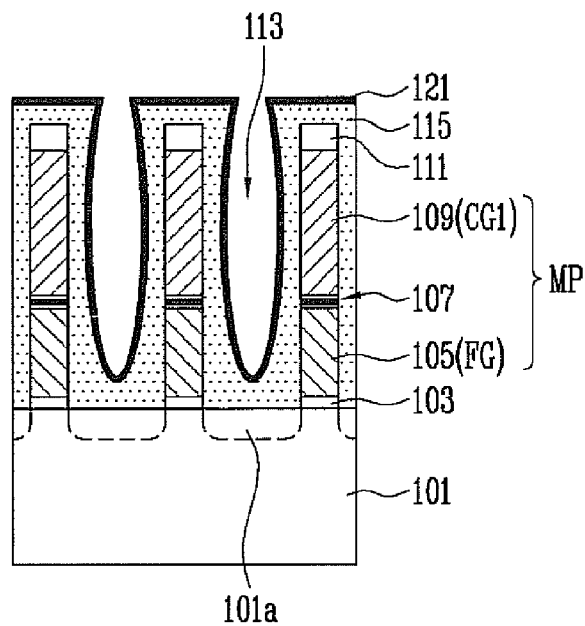

Referring to FIG. 2C, the first air gaps 113 are exposed by removing a part of the first insulation layer 115 using an etch process that generate reaction by-products and is performed over the first air gaps 113. A first sacrificial layer 121 is formed on the inner walls of the exposed first air gaps 113.

According to an example, the first sacrificial layer 121 is formed of the reaction by-products generated when the first insulation layer 115 is etched. The first sacrificial layer 121 may be removed by heat generated in a subsequent process or by using an additional $O_2$ strip process. Etch material and equipment used in the etch process that generate the reaction by-products are well-known in the art.

When the first sacrificial layer 121 is formed by the etch process of the first insulation layer 115 as described above, the first insulation layer 115 is protected by the first sacrificial layer 121 without being further exposed on the sidewalls and the bottom of the first air gaps 113 during the etch process of the first insulation layer 115 for creating openings into the first air gaps 113.

Figure 2D:
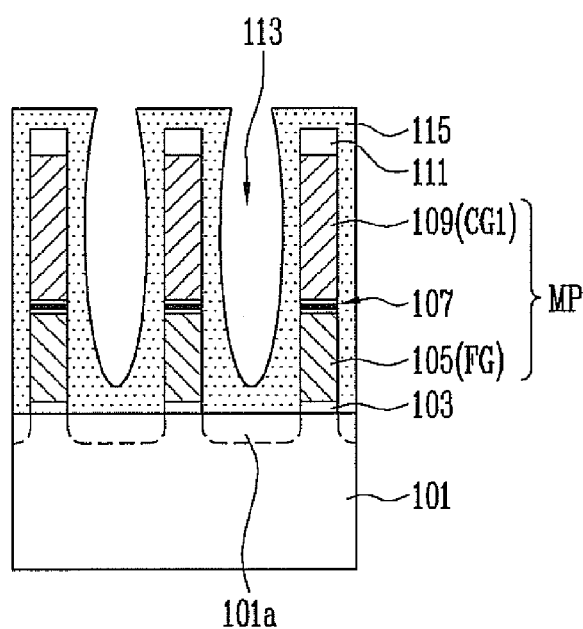

Referring to FIG. 2D, the first sacrificial layer 121 is removed.

Figure 2E:
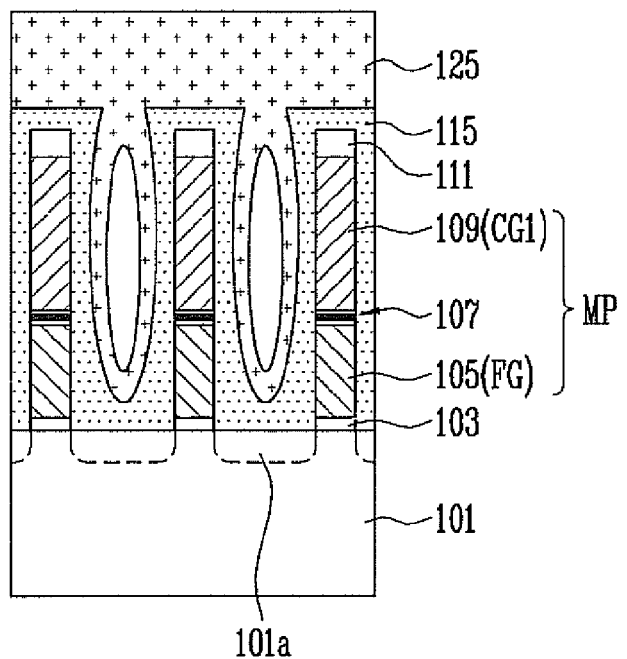

Referring to FIG. 2E, a second sacrificial layer 125 is formed on the entire structure from which the first sacrificial layer 121 has been removed. According to an example, the second sacrificial layer 125 is made of material having the same dry etch selectivity as the first insulation layer 115. Further, in order to selectively remove the second sacrificial layer 125 in a subsequent process, the second sacrificial layer 125 preferably is made of material having a high wet etch selectivity with respect to the first insulation layer 115. For example, the second sacrificial layer 125 may be formed of a dichlorosilane-high temperature oxide (DCS-HTO) layer, a poly silazane (PSZ) layer, an ultra low temperature oxide (ULTO) layer, a spin-on carbon (SOC) layer, or a phosphosilicate glass (PSG) layer.

When the second sacrificial layer 125 is formed, the combined insulation layer of the second sacrificial layer 125 and the first insulation layer 115 remaining over the semiconductor substrate 101 the sidewalls of the stack patterns MP becomes thicker and equal the sum of the thickness of the first insulation layer 115 and the thickness of the second sacrificial layer 125.

Figure 2F:
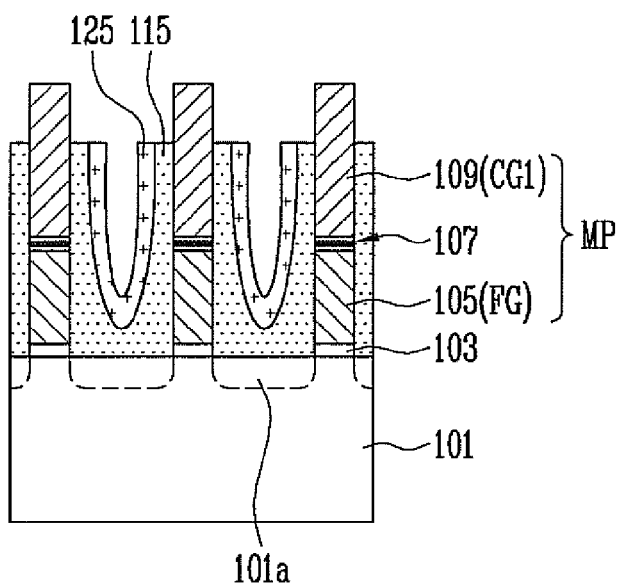

Referring to FIG. 2F, in order to expose the first conductive layer 109, the first insulation layer 115 and the second sacrificial layer 125 are etched by a dry etch process. According to an example, the dry etch process is performed such that not only the top of the first conductive layer 109, but also the sidewalls thereof are exposed to a specific depth in order to increase the contact area of the first conductive layer 109 and a metal layer formed in a subsequent process. Further, the etch depth is limited to an upper portion of the dielectric layer 107 in order not to damage the dielectric layer 107.

Further, the dry etch process may be performed using an etch-back process or an etch process that generate reaction by-products as described above. The dry etch process is performed after the second sacrificial layer 125 is formed. Thus, even though the thickness of the first insulation layer 115, formed on the semiconductor substrate 101 and on the sidewalls of the stack patterns MP, may be thin, the first insulation layer 115 formed on the semiconductor substrate 101 and on the sidewalls of the stack patterns MP may be shielded by the second sacrificial layer 125 during the dry etch process.

Meanwhile, if the dry etch process is performed using the etch process that generate reaction by-products, the first insulation layer 115, formed on the semiconductor substrate 101 and on the sidewalls of the stack patterns MP, can be protected by the reaction by-products during the dry etch process. The reaction by-products are removed by an $O_2$ strip process performed after the dry etch process and heat generated in a subsequent process.

The first conductive layers 109 of the stack patterns MP can be uniformly exposed because the first insulation layer 115 and the second sacrificial layer 125 have a similar dry etch selectivity.

Figure 2G:
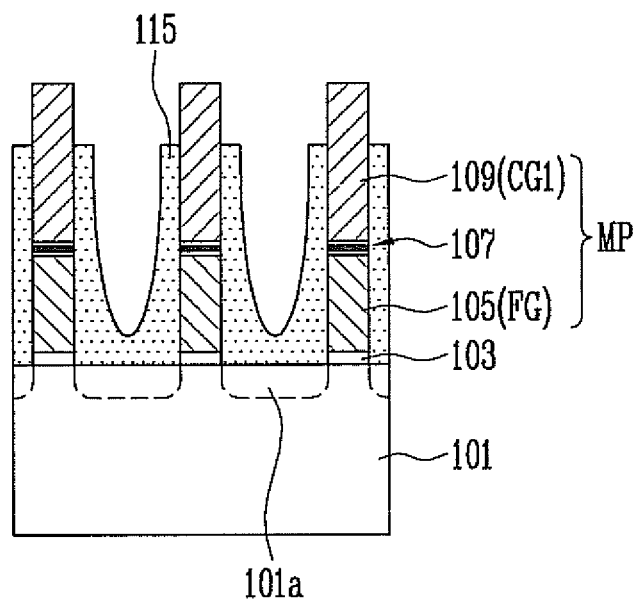

Referring to FIG. 2G, the remaining second sacrificial layers 125 are selectively removed by a wet etch process, thereby exposing the first insulation layers 115.

Figure 2H:
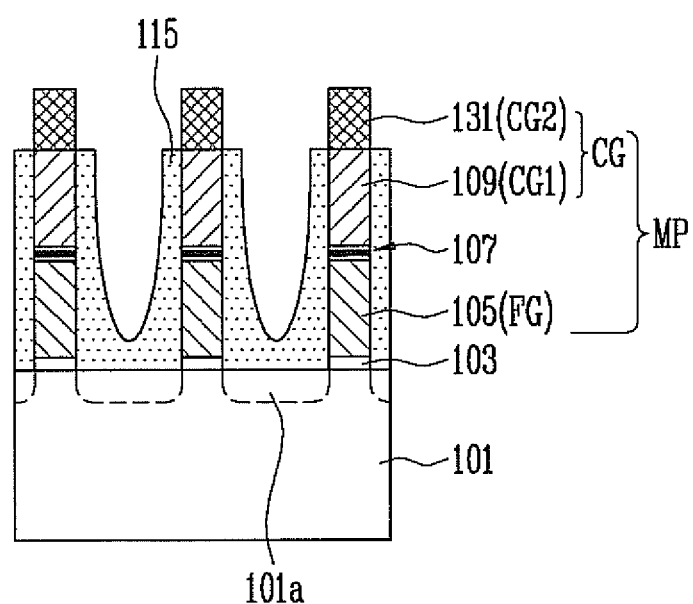

Referring to FIG. 2H, metal silicide layers 131 are formed by siliciding upper portions of the first conductive layers 109 through a silicidation process.

The silicidation process includes a process of forming a metal layer on the first conductive layer 109, a primary annealing process performed at a first temperature in order to diffuse metal of the metal layer into the first conductive layer 109 (that is, the polysilicon layer), a process of removing the remaining metal layer that did not react during the primary annealing process, and a secondary annealing process performed at a second temperature higher than the first temperature in order to form the metal silicide layer 131 of low resistance. The metal silicide layers 131 formed by the secondary annealing process become second control gates CG2. The second control gates CG2 are formed by siliciding the first control gates CG1. Accordingly, the second control gates CG2 are connected in a direction crossing the active regions and form word lines.

According to an example, cobalt (Co), nickel (Ni), or tungsten (W) may be used as the metal layer for the silicidation process. If the silicidation process is performed using cobalt (Co), a cobalt silicide layer of a CoSi phase is formed by the primary annealing process, and the cobalt silicide layer of a CoSi phase is changed into the cobalt silicide layer of a $CoSi_2$ phase by the secondary annealing process. The cobalt silicide layer of a $CoSi_2$ phase is more stable than the cobalt silicide layer of a CoSi phase and has lower resistance than the cobalt silicide layer of a CoSi phase.

Figure 2I:
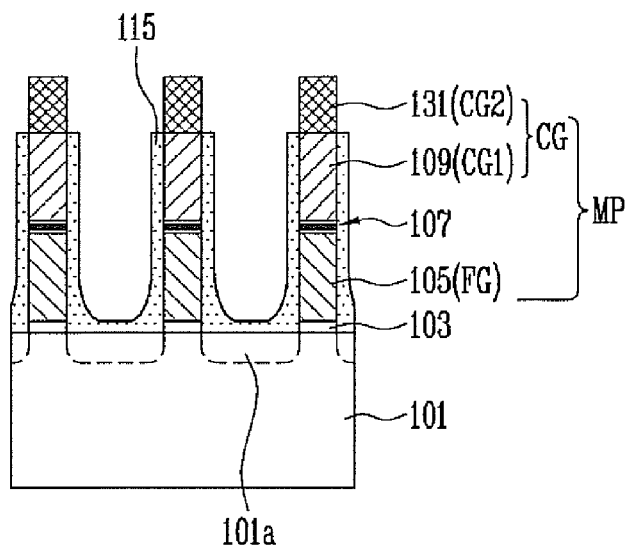

Referring to FIG. 2I, if the aspect ratio of the stack pattern MP is sufficiently low enough to withstand process stress, the first insulation layer 115 may be further etched using an isotropic wet etch method in order to ensure appropriate volumes for the second air gaps subsequently formed. Here, the wet etch thickness is controlled in order not to expose the semiconductor substrate 101 and the stack patterns MP.

Figure 2J:
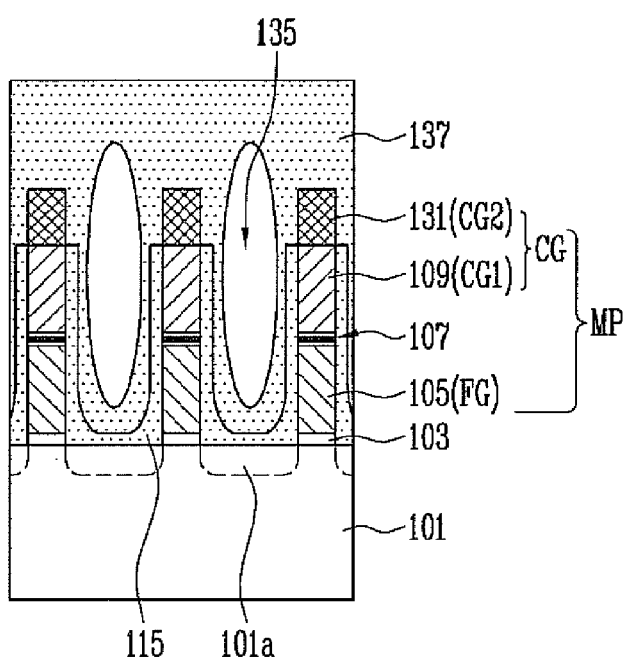

Referring to FIG. 2J, a second insulation layer 137 (that is, a deposition layer) having a low step coverage is formed on the entire structure having the metal silicide layers 131 formed therein so that a second air gap 135 is formed in the space between the neighboring stack patterns MP. For example, the second insulation layer 137 may be formed of a disilane-high temperature oxide (DS-HTO) layer or a plasma enhanced-$SiH_4$ undoped silicate glass (PE-$SiH_4$ USG) layer as in the first insulation layer 115.

By applying the above processes, the semiconductor device according to the first exemplary embodiment of this disclosure includes control gates CG, each having a stack structure of the first conductive layer 109 and the metal silicide layer 131. The dielectric layer 107 and the floating gate FG are further stacked under the control gate CG, and the tunnel insulation layer 103 is further stacked under the floating gate FG. Further, the first insulation layer 115 is formed on the sidewalls of the stack type gates and the surface of the semiconductor substrate 101 between the stack type gates of the semiconductor device according to the first exemplary embodiment of this disclosure, each having the stack structure of the tunnel insulation layer 103, the dielectric layer 107, and the control gate CG. Meanwhile, the metal silicide layer 131 of the control gate CG protrudes over the first insulation layer 115. Further, the second insulation layer 137 is formed on the first insulation layers 115 and the metal silicide layers 131. The second insulation layer 137 is formed to cover the upper portion of the space between the stack type gates so that the second air gap 135 is formed in the space between the stack type gates.

In the first exemplary embodiment of this disclosure as described above, the polish process is stopped before the first air gaps and the polysilicon layers are exposed/opened. Accordingly, slurry used in the polish process which may remain within the first air gap and damage to a surface of the first conductive layer (that is, the polysilicon layer) that may occur otherwise may be prevented. Further, the first sacrificial layer is formed and the first air gaps are exposed by the dry etch process. Accordingly, the first insulation layer at the bottom and on the sidewalls of the first air gap can be protected by the first sacrificial layer. In the present embodiment, in the state in which the first insulation layer at the bottom and on the sidewalls of the first air gap is protected by the second sacrificial layer by forming the second sacrificial layer after the first sacrificial layer is removed, the first conductive layer (that is, the polysilicon layer) is exposed by the dry etch process. Accordingly, a surface of the first conductive layer may be prevented from being damaged when the first conductive layer is exposed and slurry may be prevented from remaining within the first air gap.

Figure 3A:
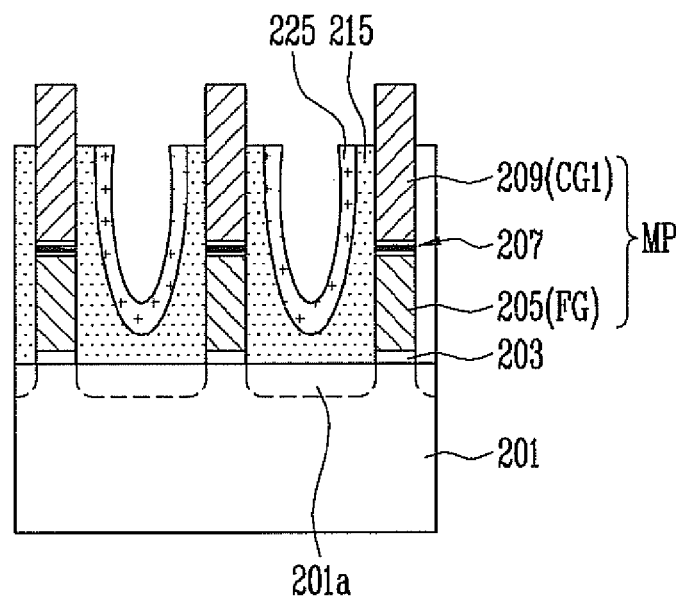
FIGS. 3A to 3C are cross-sectional views illustrating a semiconductor device and a method of manufacturing the same according to a second exemplary embodiment of this disclosure.
Figure 3B:
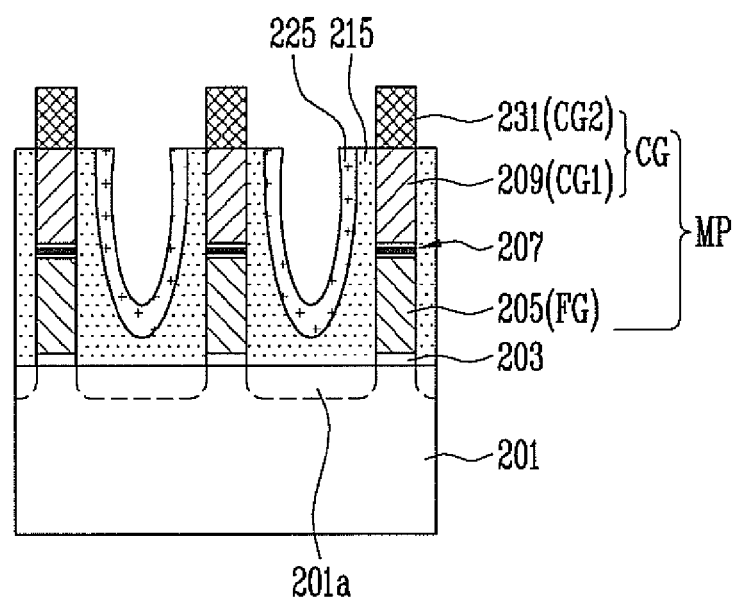
Figure 3C:
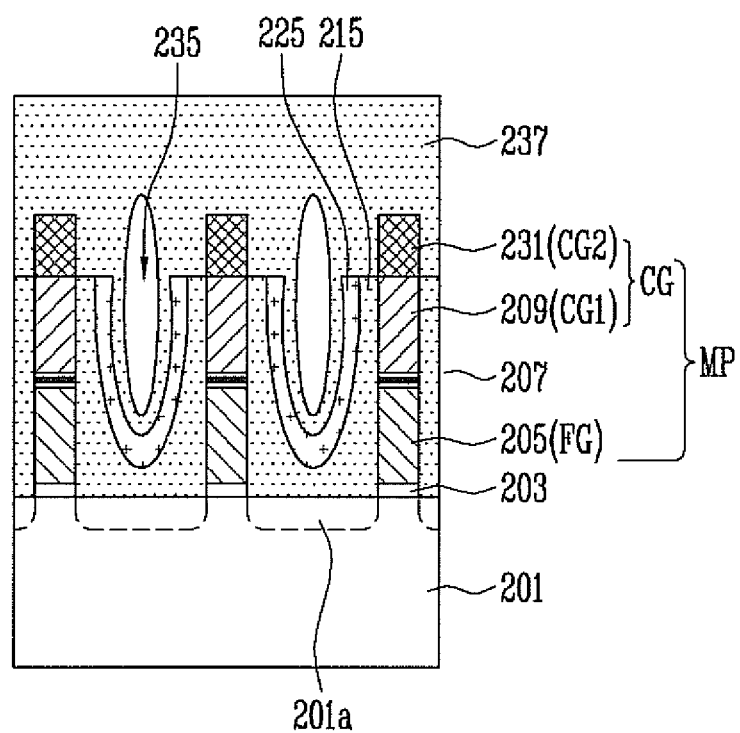

FIGS. 3A to 3C are cross-sectional views illustrating a semiconductor device and a method of manufacturing the same according to a second exemplary embodiment of this disclosure. In the drawings for the figures, according to an example, word line formation regions coupled to the memory cells of a NAND flash memory device are shown.

Referring to FIG. 3A, a tunnel insulation layer 203 and a plurality of stack patterns MP spaced apart from one another are formed over a semiconductor substrate 201 by using the same method as described with reference to FIG. 2A. As described above with reference to FIG. 2A, each of the stack patterns MP includes a conductive layer 205 for a floating gate FG, a dielectric layer 207, and a first conductive layer 209 for a first control gate CG1 which are stacked over the tunnel insulation layer 203. Next, as described above with reference to FIG. 2A, cell junctions 201a are formed.

As described above with reference to FIG. 2A, a first insulation layer 215 is formed so that a first air gap can be formed between the neighboring stack patterns MP. Next, an interlayer insulation layer and an etch-stop layer are stacked.

As described above with reference to FIG. 2B, the etch-stop layer is exposed by a process of polishing the interlayer insulation layer, and the exposed etch-stop layer is removed. Next, a part of the first insulation layer 215 is removed by an etch-back process so that the first air gaps are not exposed.

As described above with reference to FIG. 2C, a part of the first insulation layer 215 is removed by an etch process that generates reaction by-products and is performed over the first air gaps. Thus, the first air gaps are exposed and, at the same time, a first sacrificial layer is formed on the inner walls of the exposed first air gaps. Next, the first sacrificial layer is removed.

As described above with reference to FIG. 2E, a second sacrificial layer 225 is formed on the entire structure from which the first sacrificial layer has been removed. As described above with reference to FIG. 2F, the first insulation layer 215 and the second sacrificial layer 225 are etched. Thus, the following layers are formed as shown in FIG. 3A: the first insulation layers 215 that are each formed on the surface of the stack pattern MP and the surface of the semiconductor substrate 101 between the stack patterns MP and have the height lower than the first conductive layer 209; and the second sacrificial layers 225 that are each formed on the surface of the first insulation layer 215 and have the height lower than the first conductive layer 209. Here, an upper portion and sidewalls of the first conductive layer 209 are exposed.

Referring to FIG. 3B, if the stack pattern MP has a high aspect ratio so as to incline by being unable to withstand stress caused by a subsequent process according to an example, metal silicide layers 231 (that is, second control gates CG2) are formed by siliciding the upper portions of the first conductive layers 209 while the second sacrificial layers 225 are not removed. The silicidation process may be the same process described with reference to FIG. 2H. The second control gates CG2 are formed by siliciding the first control gates CG1 and are coupled in a direction crossing the active regions and form word lines.

Referring to FIG. 3C, the stack pattern MP may have a high aspect ratio so as to incline by being unable to withstand stress caused by a subsequent process according to an example. Then, while the second sacrificial layers 225 have not been removed as shown in FIG. 3B, a second insulation layer 237 (that is, a deposition layer) having a low step coverage may be formed on the entire structure having the metal silicide layers 231 formed therein so that a second air gap 235 can be formed in the space between the neighboring stack patterns MP. According to an example, the second insulation layer 237 may be formed of a disilane-high temperature oxide (DS-HTO) layer or a plasma enhanced-$SiH_4$ undoped silicate glass (PE-$SiH_4$ USG) layer as in the first insulation layer 215. According to another example, the second insulation layer 237 may be formed in the state where the second sacrificial layer 225 has been removed and the first insulation layer 215 has not been further etched.

By applying the above processes, the semiconductor device according to the second exemplary embodiment of this disclosure includes control gates CG, each having a stack structure of the first conductive layer 209 and the metal silicide layer 231. The dielectric layer 207 and the floating gate FG are further stacked under the control gate CG, and the tunnel insulation layer 203 is further stacked under the floating gate FG. Further, the first insulation layer 215 is formed on the sidewalls of the stack type gate and the surface of the semiconductor substrate 201 between the stack type gates of the semiconductor device according to the second exemplary embodiment of this disclosure, having the stack structure of the tunnel insulation layer 203, the dielectric layer 207, and the control gate CG. Further, the second sacrificial layer 225 (that is, an insulation layer) remains on a surface of the first insulation layer 215 and functions to prevent the stack type gate over the first insulation layer 215 from inclining. Meanwhile, the metal silicide layer 231 of the control gate CG protrudes over the first insulation layer 215 and the second sacrificial layer 225. The second insulation layer 237 is formed over the second sacrificial layer 225 and the metal silicide layers 231. The second insulation layer 237 is formed to cover the upper portion of the space between the stack type gates so that the second air gap 235 can be formed in the space between the stack type gates.

As described above, in the second exemplary embodiment of this disclosure, the polish process is stopped before the first air gaps and the polysilicon layers are exposed/opened. Accordingly, slurry used in the polish process which may remain within the first air gap and damage to a surface of the first conductive layer (that is, the polysilicon layer) that may occur otherwise may be prevented. Further, the first sacrificial layer is formed and the first air gaps are exposed by the dry etch process. Accordingly, the first insulation layer at the bottom and on the sidewalls of the first air gap can be protected by the first sacrificial layer. Further, in the present disclosure, in the state in which the first insulation layer at the bottom and on the sidewalls of the first air gap is protected by the second sacrificial layer by forming the second sacrificial layer after the first sacrificial layer is removed, the first conductive layer (that is, the polysilicon layer) is exposed by the dry etch process. Accordingly, a surface of the first conductive layer may be prevented from being damaged when the first conductive layer is exposed and slurry may be prevented from remaining within the first air gap can be improved.

According to the present disclosure, loss of the first insulation layer, which is exposed at the bottom of the opened first air gap and the sidewalls of the first air gaps, during the dry etch process may be prevented by the sacrificial layer. Accordingly, damage to a surface of the semiconductor substrate due to the loss of the first insulation layer may be prevented.

According to an exemplary embodiment, the polish process of the first insulation layer is stopped before the first air gaps and the polysilicon layers are exposed. Accordingly, slurry used in the polish process may be prevented from remaining within the first air gap and damage to a surface of the polysilicon layer may be prevented.

According to an exemplary embodiment, the polysilicon layer can be uniformly exposed by uniformly removing the sacrificial layer and the first insulation layer using the silicidation process of a dry etch process.

Further, according to an exemplary embodiment, after the silicidation process, the second insulation layer is formed so that the second air gaps may be formed.

Accordingly, an appropriate resistance between conductive wires including the metal silicide layers through the silicidation process may be obtained.

What is claimed is:

1. A method of manufacturing a semiconductor device, the method comprising:
   forming gate patterns spaced apart from one another over a semiconductor substrate, wherein each of gate pattern includes a polysilicon layer;
   forming a first insulation layer over the semiconductor substrate having the gate patterns formed therein so that a first air gap is formed between the gate patterns;
   opening the first air gap by partially removing the first insulation layer over the first air gap;
   forming a sacrificial layer made of a material different than that of the first insulation layer, over the first insulation layer, wherein the sacrificial layer is formed alone an inner surface of the first air gap;
   partially etching the sacrificial layer and the first insulation layer to expose a part of each of the gate patterns;
   siliciding the exposed parts of the gate patterns; and
   forming a second insulation layer over the semiconductor substrate having the silicided gate patterns formed therein, wherein a second air gap is formed between the silicided gate patterns.

2. The method of claim 1, wherein the sacrificial layer is formed of a dichlorosilane-high temperature oxide (DCS-HTO) layer, a poly silazane (PSZ) layer, an ultra low temperature oxide (ULTO) layer, a spin-on carbon (SOC) layer, or a phosphosilicate glass (PSG) layer.

3. The method of claim 1, wherein a wet etch selectivity of the sacrificial layer with respect to the first insulation layer is higher than a dry etch selectivity of the sacrificial layer with respect to the first insulation layer.

4. The method of claim 3, wherein partially etching the sacrificial layer and the first insulation layer is performed by a dry etch process.

5. The method of claim 4, further comprising exposing the first insulation layer by removing remaining sacrificial layer using a wet etch process before or after the siliciding of the gate patterns.

6. The method of claim 1, wherein opening the first air gap comprises:
   partially removing the first insulation layer so that the first insulation layer remains over the first air gap; and
   removing the first insulation layer that remains over the first air gap by using an etch material that generate reaction by-products in a reaction with the first insulation layer.

7. The method of claim 6, wherein the reaction by-products are stacked on the inner surface of the first air gap and are subsequently removed by an annealing process or an $O_2$ strip process.

8. The method of claim 1, wherein the second insulation layer is made of the same material as the first insulation layer.

9. The method of claim 1, wherein the first and the second insulation layers are formed of a disilane-high temperature oxide (DS-HTO) layer or a plasma enhanced-$SiH_4$ undoped silicate glass (PE-$SiH_4$ USG) layer.

* * * * *

UNITED STATES PATENT AND TRADEMARK OFFICE
CERTIFICATE OF CORRECTION

PATENT NO. : 8,609,507 B2
APPLICATION NO. : 13/149365
DATED : December 17, 2013
INVENTOR(S) : Tae Kyung Kim et al.

It is certified that error appears in the above-identified patent and that said Letters Patent is hereby corrected as shown below:

On the Title Page

Item (75) should read, Inventors: Tae Kyung Kim, Chungcheongbuk-do (KR); Min Sik Jang, Gyeonggi-do (KR); Sang Deok Kim, Gyeonggi-do (KR)

Signed and Sealed this
Eleventh Day of March, 2014

Michelle K. Lee
*Deputy Director of the United States Patent and Trademark Office*